(12) United States Patent
Han et al.

(10) Patent No.: US 7,501,656 B2
(45) Date of Patent: Mar. 10, 2009

(54) LIGHT EMITTING DIODE PACKAGE WITH DIFFUSER AND METHOD OF MANUFACTURING THE SAME

(75) Inventors: Seong Yeon Han, Suwon (KR); Seon Goo Lee, Gunpo (KR); Chang Ho Song, Seoul (KR); Jung Kyu Park, Seoul (KR); Young Sam Park, Seoul (KR); Kyung Taeg Han, Hwasung (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 308 days.

(21) Appl. No.: 11/491,947

(22) Filed: Jul. 25, 2006

(65) Prior Publication Data

US 2007/0045644 A1 Mar. 1, 2007

(30) Foreign Application Priority Data

Jul. 26, 2005 (KR) ...................... 10-2005-0067859

(51) Int. Cl.
*H01L 27/15* (2006.01)
*H01L 31/12* (2006.01)
*H01L 33/00* (2006.01)

(52) U.S. Cl. ..................... 257/79; 257/98; 257/E33.001
(58) Field of Classification Search .................. 257/79, 257/81, 95, 98, 99, E31.127, E33.001
See application file for complete search history.

(56) References Cited

U.S. PATENT DOCUMENTS

2002/0011601 A1 1/2002 Furukawa et al.
2005/0057144 A1 3/2005 Morita et al.
2005/0253159 A1* 11/2005 Creswick et al. .............. 257/98

FOREIGN PATENT DOCUMENTS

| CN | 1336693 A | 2/2002 |
| CN | 1492506 A | 4/2004 |
| JP | 5-240665 | 9/1993 |
| JP | 2001-060724 | 3/2001 |
| JP | 2002-176201 | 6/2002 |

OTHER PUBLICATIONS

Chinese Office Action, with English Translation, issued in Chinese Patent Application No. CN 2006101078422, issued on Feb. 15, 2008.
Korean Office Action issued in corresponding Korean Patent Application No. KR 10-2005-0067859, dated Jun. 17, 2006.

* cited by examiner

*Primary Examiner*—Hoai V Pham
(74) *Attorney, Agent, or Firm*—McDermott Will & Emery LLP

(57) ABSTRACT

The invention relates to an LED package for facilitating color mixing using a diffuser and a manufacturing method of the same. The LED package includes a substrate with an electrode formed thereon, and an LED chip mounted on the substrate. The LED package also includes an encapsulant applied around the light emitting diode chip, containing a diffuser. The LED package further includes a lens part disposed on the light emitting diode chip and the encapsulant to radiate light in a wide angle. The LED package allows light from the light emitting diode chip to be emitted out of the package without distortion. The invention allows light to exit through the encapsulant containing the diffuser and the lens part, achieving uniform diffusion and emission of light from the LED chip, thereby increasing a radiating angle and obtaining a uniform light source.

6 Claims, 7 Drawing Sheets

LIGHT EMITTING DIODE PACKAGE WITH DIFFUSER AND METHOD OF MANUFACTURING THE SAME

CLAIM OF PRIORITY

This application claims the benefit of Korean Patent Application No. 2005-67859 filed on Jul. 26, 2005, in the Korean Intellectual Property Office, the disclosure of which is incorporated herein by reference.

BACKGROUND OF THE INVENTION

1. Field of the Invention

The present invention relates to a Light Emitting Diode (LED) package incorporating a diffuser to facilitate color mixing and to a manufacturing method of the same. More particularly, the invention relates to an LED package in which a diffuser is applied to an encapsulant disposed in an upper part of an LED chip to achieve color mixing, enabling uniform emission without distortion of light from the LED chip in a wide radiating angle, thereby facilitating color mixing while reducing a thickness and enhancing a degree of freedom of a lens part, and to a manufacturing method of the same.

2. Description of the Related Art

In general, various sizes of LED packages are used for backlight units of mobile phones or Personal Digital Assistants (PDAs).

Such conventional LED packages are increasingly reduced in its thickness as the backlight units are becoming slimmer.

For such backlight units, the LED packages are popular as light sources therefor, and thus various structures or shapes of LED package are currently examined and developed.

The LED packages used for LCD Televisions or monitors are structurally categorized into an edge lighting type, a top emitter, and a side emitter. The most important factor among these LED packages is to achieve good color mixing to make a white light source.

Such an example of a conventional LED package is illustrated in FIG. 1.

The conventional LED package 200, disclosed in U.S. Patent No. 2005-0057144, includes a substrate 205 with electrode patterns 207a and 207b formed thereon, and an LED chip 210 mounted on the electrode pattern 207b and electrically connected to the electrode patterns 207a and 207b by wires 211.

The conventional LED package 200 has a reflecting frame 212 disposed on the substrate 205 for housing the LED chip 210, and a reflecting layer 214 formed on an inner side of the reflecting frame 212. The reflecting layer 214 serving as a reflecting surface is made of Al and/or Ag having high reflectivity deposited or painted thereon.

In addition, a wavelength-converting material part 220 is formed in an inner space of the reflecting frame 212 where the LED chip 210 is mounted. The wavelength-converting material part 220 comprises transparent resin containing a phosphor 222a and a diffuser 222b, and encapsulates the LED chip 210.

In the above-described LED package 200, when emission takes place from the LED chip 210 and light is emitted, the light is directed to the wavelength-converting material part 220 by the reflecting layer 214. The light then collides with the phosphor 222a contained in the wavelength-converting part 220 to excite the phosphor 222a, and is scattered by a plurality of diffusers 222b contained in the wavelength-converting material part 220. As a result, light having a longer wavelength than the light that was incident onto the phosphor 222a exits the package due to the interaction between the phosphor 222a and the diffuser 222b.

Although the conventional technology is useful for elongating the wavelength of light emitted from the LED chip 210 and emitting white light, it does not necessarily allow uniform light emission. The conventional technology allows color mixing to generate white light, but emits white light only forward without a variety in radiating angles. Further, as it realizes white light using the phosphor 222a, it has mediocre color reproducibility.

Another conventional LED package 250 is illustrated in FIG. 2.

As disclosed in Japanese Patent Application Publication No. 2001-60724, the LED package 250 includes an LED chip 260 positioned in a lamp housing 255 having a hollow part, electrodes 262a and 262b drawn out from the LED chip 260, and an encapsulant 270 filled in the lamp housing 255 for fixing the LED chip 260 and the electrodes 262a and 262b.

In such a conventional LED package 250, the lamp housing 255 having a hollow part is disposed such that its emitting surface is positioned in a lower part. Then, the encapsulant 270 composed of transparent thermosetting resin with glass beads 272 having a high refractive ratio mixed therein at a suitable ratio is injected into the hollow part of the lamp housing 255 from the back of the LED chip 260.

Then, after the glass beads 272 precipitate in the encapsulant 270 made of transparent thermosetting resin, the encapsulant 270 is heated and cured to complete the LED package 250.

In such a conventional LED package 250, the glass beads 272 in the encapsulant 270 of transparent thermosetting resin function as a diffuser and scatter light to some degree. However, the light is directed only forward in a not-so-wide radiating angle due to the hollow part of the lamp housing 255, and it is difficult to reduce the thickness of the LED package 250 due to the structural characteristics of the electrodes 262a and 262b and the lamp housing 255.

In addition, the conventional LED package 250 is complicated to manufacture, thus not suitable for mass production.

FIG. 3 illustrates yet another conventional LED package 300. The conventional LED package 300 includes a base substrate 305 with electrodes 310a and 310b formed thereon, an LED chip 312 mounted on and connected to the electrodes 310a and 310b, and a molded frame 315 having a groove, thus being fixed around the LED chip 312.

Then, a molding member 317 containing a diffuser 317a is filled in the groove of the molded frame 315. This conventional LED package 300 achieves high luminance and contrast ratio using the diffuser 317a contained in the molding member 317 made of transparent resin, thereby enabling a high contrast display in a large angle of visibility in high precision.

However, the conventional LED package 300 also emits light only forward from the molded frame 315, and does not achieve excellent light emission.

When applied to the backlight units to produce white light using red, green, and blue lights, each of the above described LED packages 200, 250 and 300 is required in a plural number to uniformly illuminate a large area and mix colors, increasing the number of components.

Therefore, the conventional LED packages 200, 250 and 300 result in increased manufacturing costs of the LCD products due to the increased number of components.

SUMMARY OF THE INVENTION

The present invention has been made to solve the foregoing problems of the prior art and therefore an object of certain embodiments of the present invention is to provide an LED package using a diffuser which achieves uniform emission of light generated from an LED chip to make a uniform light source, and a manufacturing method of the same.

Another object of certain embodiments of the invention is to provide an LED package using a diffuser which emits light generated from an LED chip in a wide radiating angle without distortion of light, thereby increasing a degree of freedom and reducing a thickness of a lens part, and a manufacturing method of the same.

Further another object of certain embodiments of the invention is to provide an LED package using a diffuser which constitutes a Liquid Crystal Display (LCD) backlight unit in a fewer number, thereby decreasing the number of LED package components and reducing the manufacturing costs of the LCD backlight unit, and a manufacturing method of the same.

According to an aspect of the invention for realizing the object, there is provided a light emitting diode package including: a substrate with an electrode formed thereon; a light emitting diode chip mounted on the substrate; an encapsulant applied around the light emitting diode chip, the encapsulant containing a diffuser; and a lens part disposed on the light emitting diode chip and the encapsulant to radiate light in a wide angle, whereby light from the light emitting diode chip is emitted out of the package without distortion.

Preferably, the substrate has a step formed on an upper surface thereof, the step surrounding a portion of the substrate where the light emitting diode chip is mounted.

Preferably, the substrate has a reflective layer formed on a side surface of a recessed portion formed on an upper surface thereof, the reflective layer surrounding the light emitting diode chip mounted on the substrate.

Preferably, the lens part is made of a material mixed with a phosphor.

Preferably, the lens part is made of a material mixed with a diffuser.

Preferably, the lens part is made of a material mixed with a phosphor and a diffuser.

According to another aspect of the invention for realizing the object, there is provided a manufacturing method of a light emitting diode package including steps of: providing a substrate with an electrode formed thereon; mounting a light emitting diode chip on the substrate; applying an encapsulant containing a diffuser to cover the light emitting diode chip; and attaching a lens part on the encapsulant, whereby light from the light emitting diode chip is emitted out of the package without distortion.

In addition, the diffuser comprises an opal based material.

Further, the opal based material is one selected from a group consisting of barium titanate, titanium dioxide, aluminum oxide, silicon dioxide and combinations thereof.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
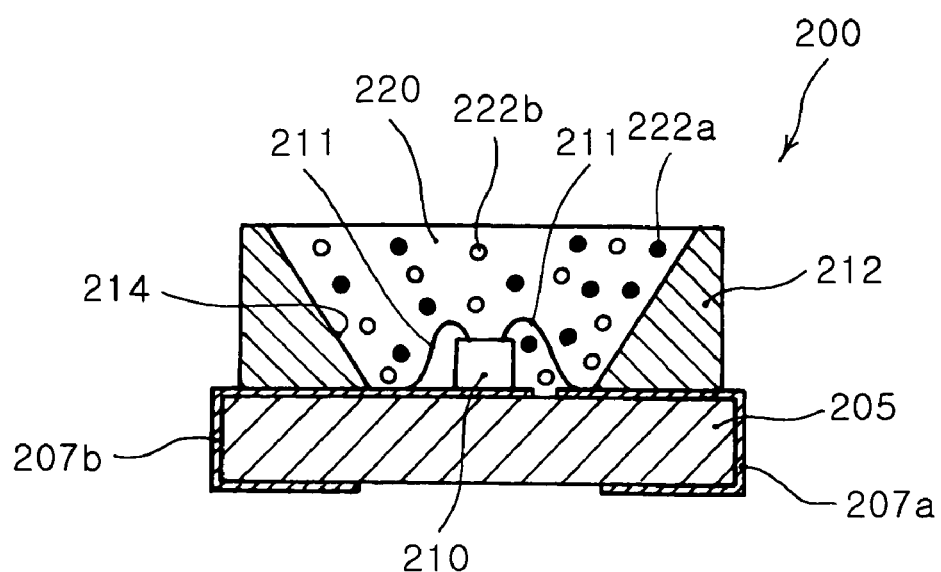
FIG. 1 is a sectional view illustrating a conventional LED package.
Figure 2:
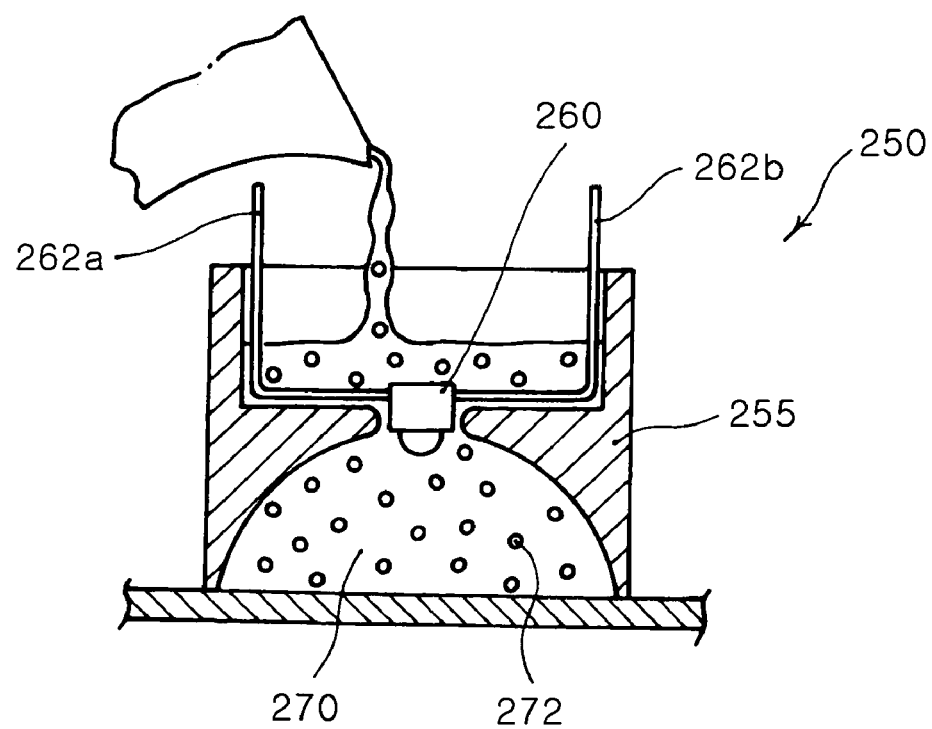
FIG. 2 is a sectional view illustrating another conventional LED package.
Figure 3:
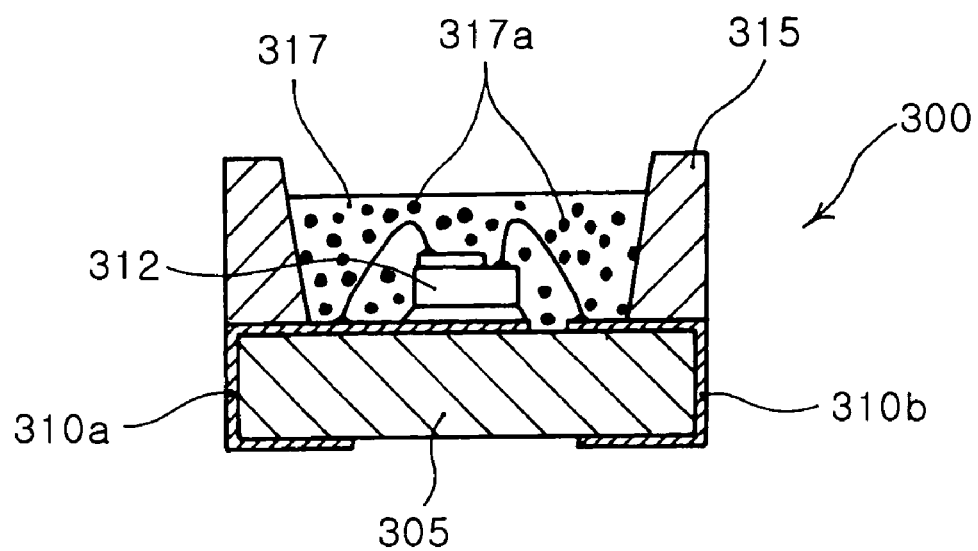
FIG. 3 is a sectional view illustrating yet another conventional LED package.
Figure 4:
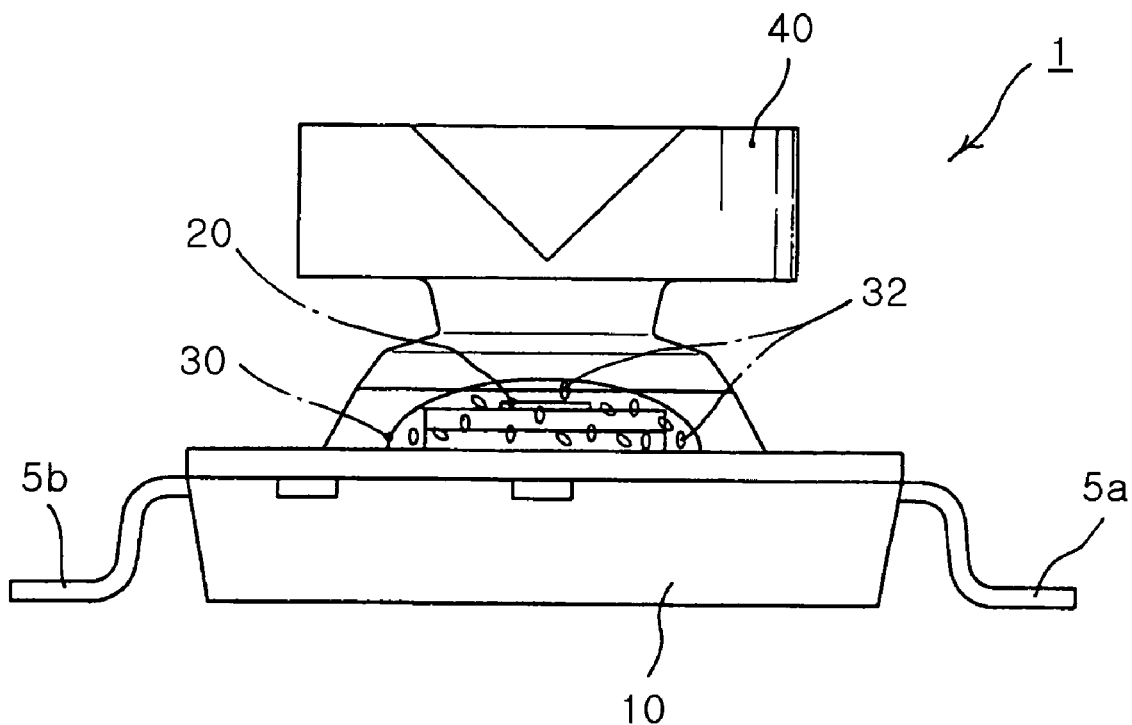
FIG. 4 is a sectional view illustrating an LED package using a diffuser according to the present invention.

As shown in FIG. 4, an LED package 1 using a diffuser according to the present invention has a substrate 10 with electrodes 5*a* and 5*b* formed thereon. The substrate 10 preferably has a planar structure molded with molding material, and has each of the electrodes 5*a* and 5*b* formed thereon to provide power to an LED chip 20 described later.

The LED chip 20 is mounted on an upper part of the substrate 10 and electrically connected to the electrodes 5*a* and 5*b* by wire bonding, etc. The invention is applicable to either a horizontal type of LED chip 20 with all electric terminals formed on an upper surface thereof, or a vertical type of LED chip 20 with electric terminals formed on both upper and lower surfaces thereof.

In addition, a step 25 is formed on an upper surface of the substrate 10 to surround the portion where the LED-chip 20 is mounted.

Such a step 25 is formed in an annular form on an upper surface of the substrate 10, and as described later, an encapsulant 30 is applied in an appropriate amount in a recessed portion formed by the step 25 and thus prevented from spreading over the substrate 10.

In addition, the encapsulant 30 is applied to cover the LED chip 20 and the substrate 10. As shown in detail in FIG. 7, the encapsulant 30, which is applied on the substrate 10 to surround the LED chip 20, contains a diffuser 32 therein. The encapsulant 30 serves to maintain a uniform light source generated from the LED chip 20, and has a diffuser 32 added thereto in order to enable diffusion of light.

Therefore, the encapsulant 30 adjusts the degree of scattering, transmittance and refraction of light with the diffuser 32 contained therein, thereby assisting uniform emission of light.

The encapsulant 30 is made of resin such as silicone or epoxy, and the diffuser 32 is made of an opal based material, i.e., one selected from a group consisting of, barium titanate, titanium dioxide, aluminum oxide, silicon dioxide and combinations thereof. The diffuser 32 is added to the encapsulant 30 in the amount of 25 weight % or less of the total weight of the encapsulant 30.

In addition, the LED package 1 has a lens part 40 disposed above the LED chip 20 and the encapsulant 30 to emit light in a wide radiating angle. The lens part 40 is formed by curing epoxy resin and the like, and preferably is made of transparent epoxy. Preferably, the lens part 40 may be made of a material with a phosphor 42 mixed therein.

Moreover, preferably, the lens part 40 may be made of a material with a diffuser 32 mixed therein instead of a phosphor 42, or both a phosphor 42 and a diffuser 32 mixed therein.

Figure 6:
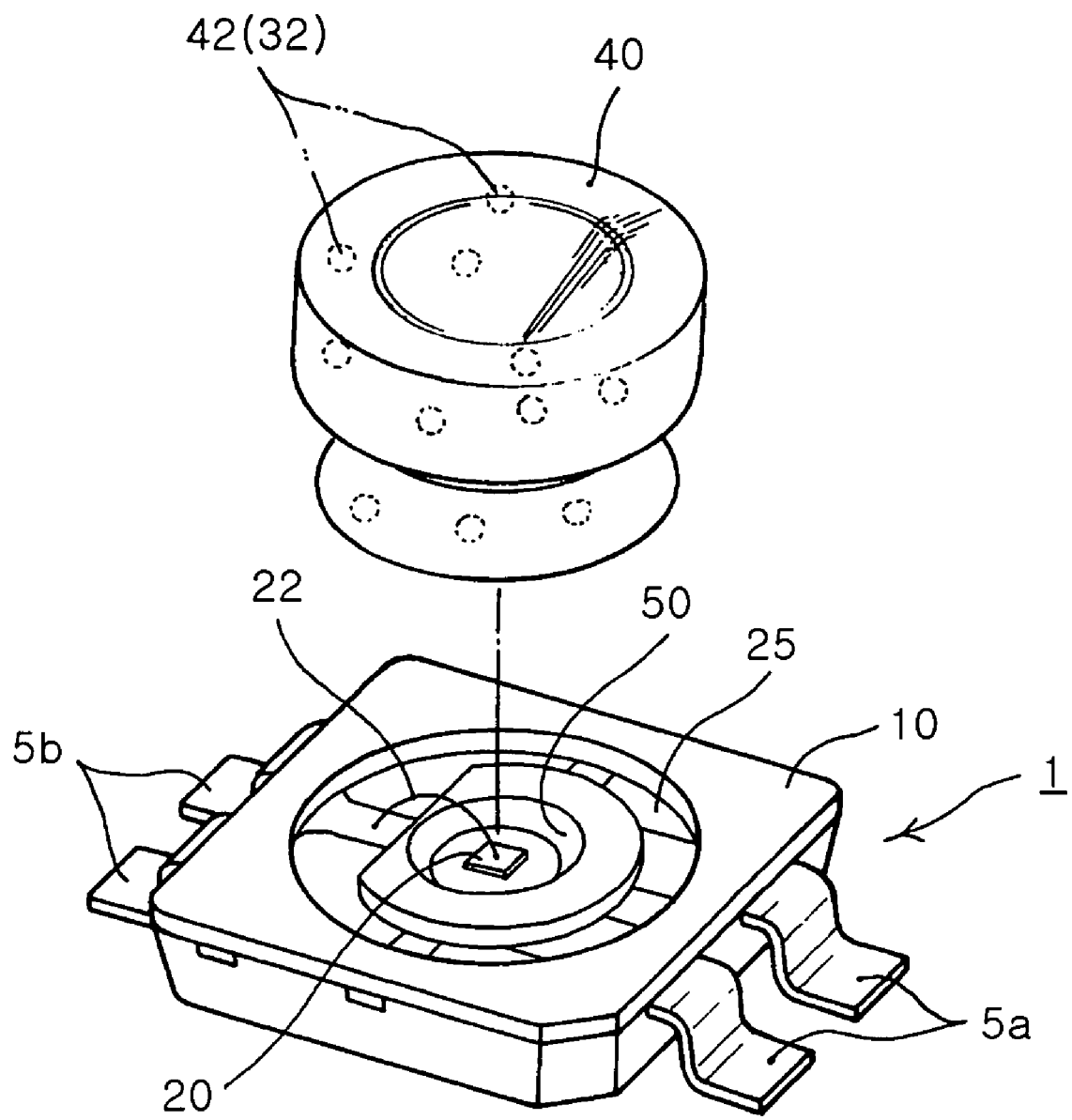
FIG. 6 is an exploded view illustrating a cavity of the LED package using a diffuser according to the present invention.

As shown in FIG. 6, the LED package 1 of the invention may preferably comprise a so-called cavity structure in which the LED chip 20 is mounted in a recessed portion on the substrate 10, and thus surrounded by a reflecting layer 50 formed on a side surface of the recessed portion.

The reflecting layer 50 may be formed by plating or depositing metal selected from a group consisting of Al, Au, Ag, Ni, W, Ti and Pt, or by applying a paint of high reflectivity.

A manufacturing method of the LED package 1 using a diffuser according to the present invention will now be explained in detail.

The manufacturing method of the LED package using a diffuser starts with a step of providing the substrate 10 with the electrodes 5a and 5b formed thereon.

The electrodes 5a and 5b are formed on the substrate 10 to supply power to the LED chip 20, and as described later, the step 25 is formed on an upper surface of the substrate 10, surrounding the portion where the LED chip 20 is mounted.

Figure 5:
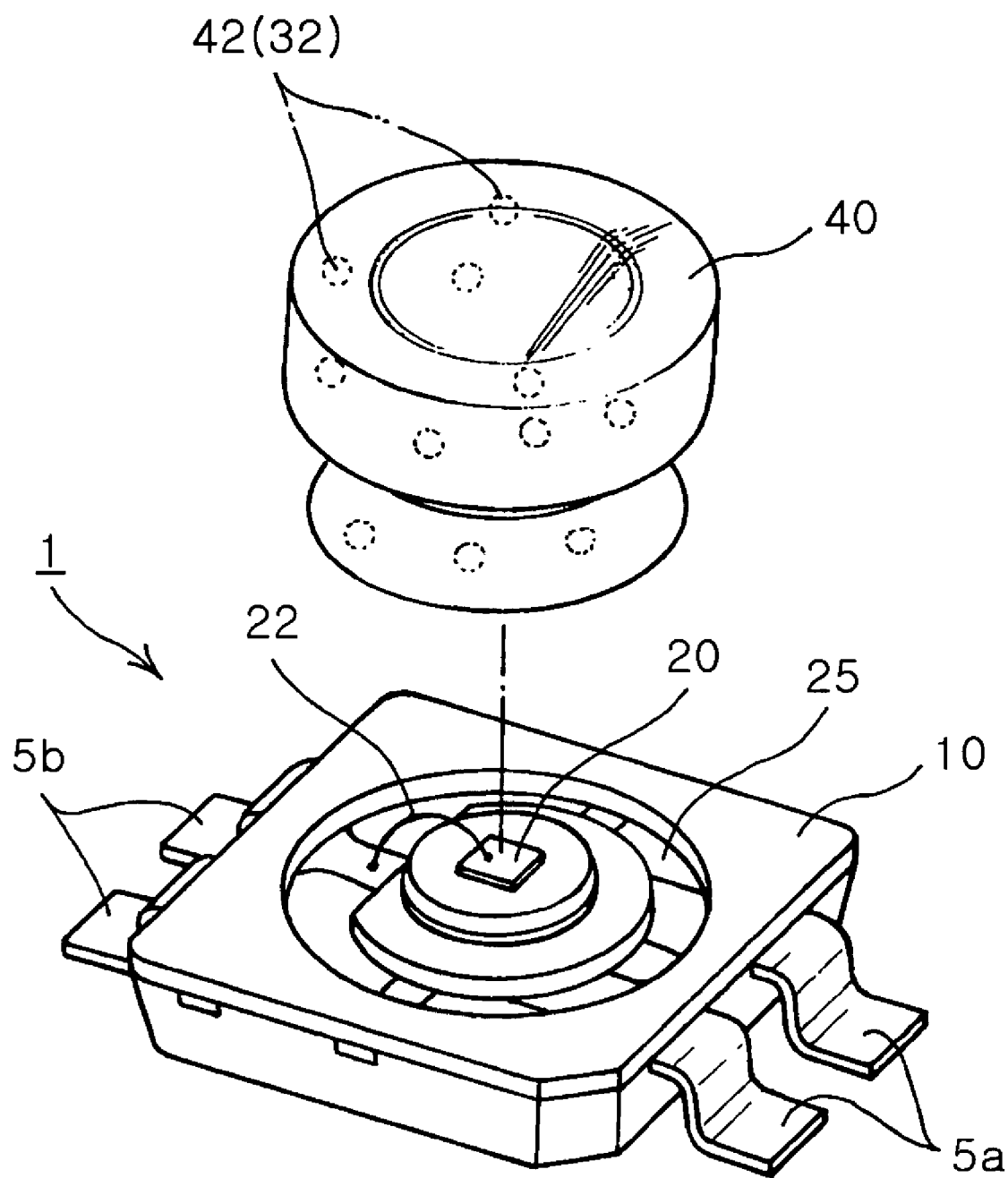
FIG. 5 is an exploded view illustrating the LED package according to the present invention.

In addition, as shown in FIG. 5, the substrate 10 may comprise a structure, in which the LED chip 20 is positioned on a protruding portion of the substrate 10, or as shown in FIG. 6, may comprise a cavity structure, in which the LED chip 20 is disposed within a recessed portion surrounded by the reflecting layer 50.

Next, the LED chip 20 is disposed on the substrate 10. The LED chip 20 is mounted on the substrate 10, and electrically connected to the electrodes 5a and 5b of the substrate 10 by wire bonding.

Then, the encapsulant 30 is applied on the LED chip 20 and the substrate 10.

Figure 7:
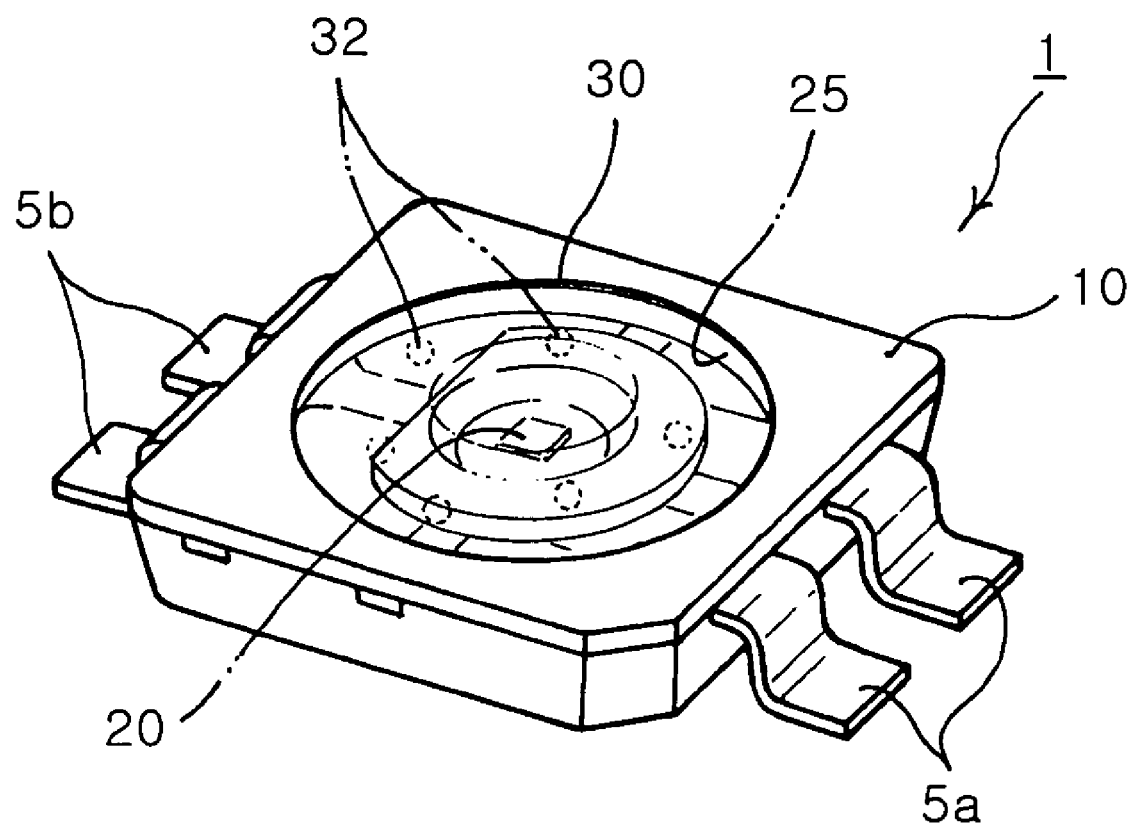
FIG. 7 is a perspective view illustrating the LED package using a diffuser with an encapsulant applied on the substrate of the LED package using a diffuser according to the present invention.

In this step, the encapsulant 30 is transparent epoxy resin containing a diffuser 32. As shown in FIG. 7, the amount of the encapsulant 30 applied is determined beforehand such that the encapsulant 30 is filled inside the recessed portion formed by the step 25 of the substrate 10 and does not spread over the substrate 10 to drip due to surface tension of the encapsulant 30.

Figure 8:
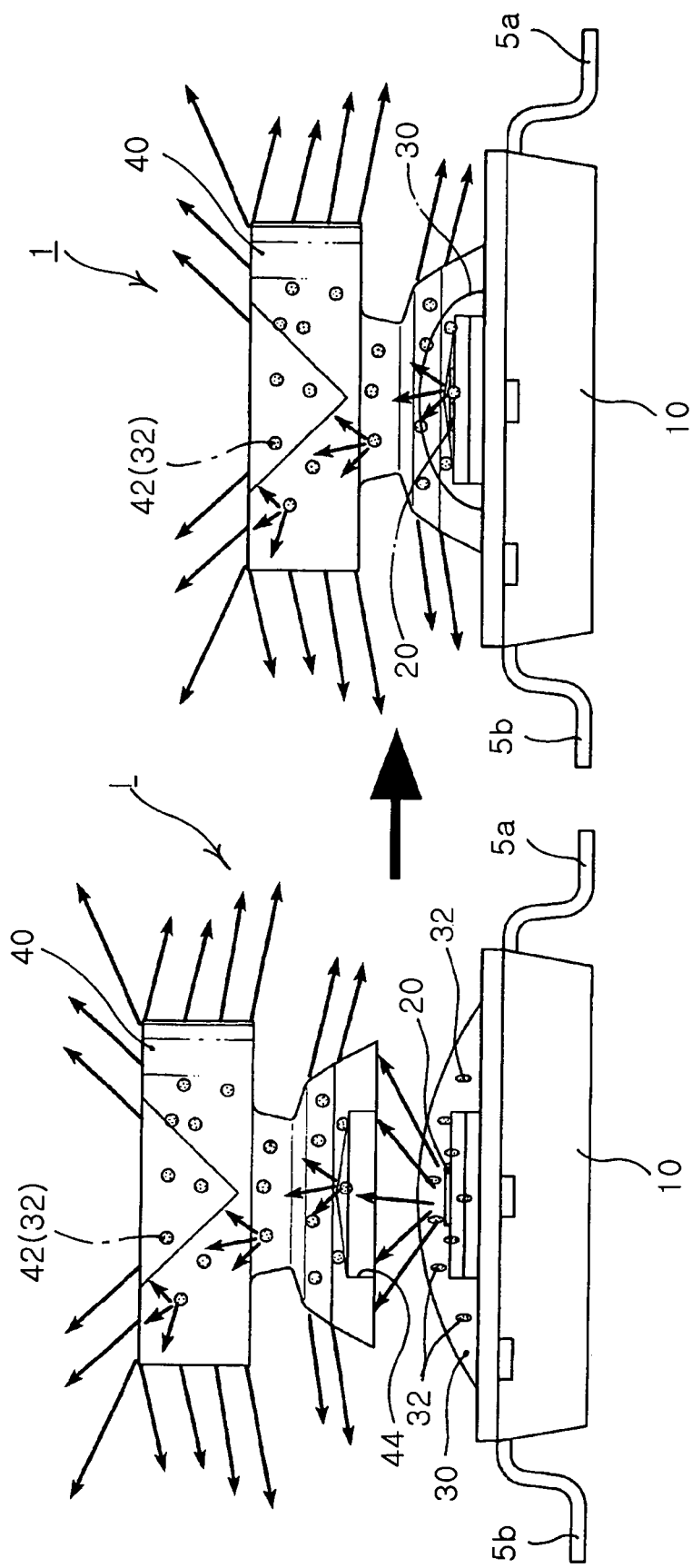
FIG. 8 is a view illustrating traces of light scattered, reflected and diffused out of the LED package using a diffuser according to the present invention.

Next, the lens part 40 is attached on the encapsulant 30. In this step, the lens part 40 is placed over the encapsulant 30, and as shown in FIG. 8, the encapsulant 30 fills up a recess 44 formed on a bottom surface of the lens part 40 to attach the lens part 40 on the substrate 10. Then, the encapsulant 30 is cured to integrally form the lens part 40 with the substrate 10.

In this step, the lens part 40 may be made of transparent material, which however may be prepared in advance to contain either a phosphor 42 or a diffuser 32 mixed therein, or both a phosphor 42 and a diffuser 32 mixed therein.

Figure 9A:
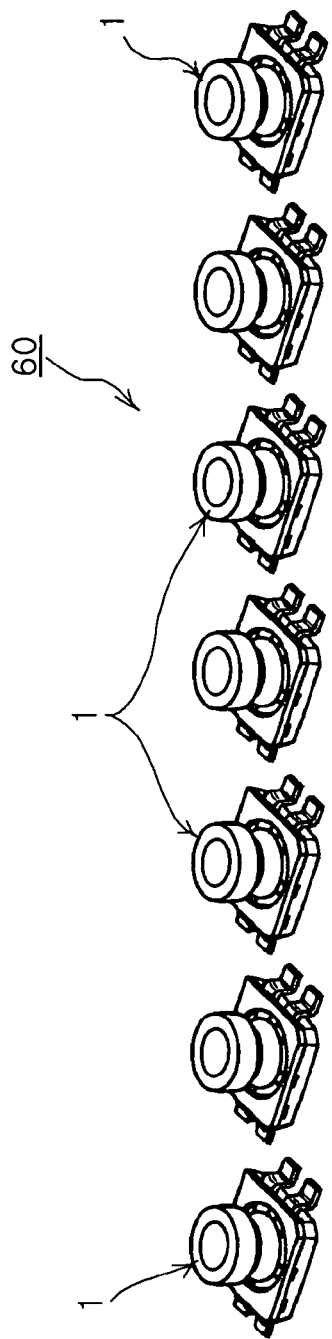
FIGS. 9(*a*) and (*b*) are views illustrating the LED packages using a diffuser of the invention disposed in an array to be used for an LCD backlight.
Figure 9B:
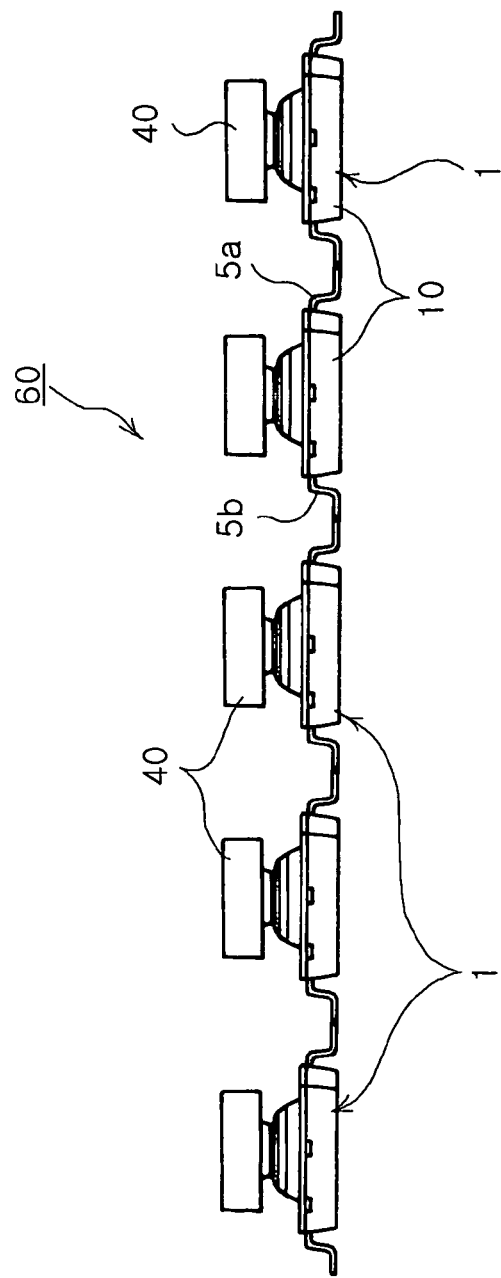

As shown in FIG. 9, the LED package 1 using a diffuser according to the present invention may be arranged in a plural number in a row to be disposed as an array in an LCD backlight unit.

In the LED package 1 using a diffuser with above described configuration, the lens part 40 is attached to the substrate 10 via the encapsulant 30 containing the diffuser 32, which is applied on the substrate 10 where the LED chip 20 is mounted.

In the LED package 1 using a diffuser according to the present invention, when light is generated from the LED chip 20, the light is emitted through the encapsulant 30 and the lens part 40, and thus emitted in a wide radiating angle. Specifically, light is diffused more broadly due to the diffuser 32 contained in the encapsulant 30 and/or the lens part 40, achieving a wider radiating angle, thereby uniformly illuminating a large area with a fewer number of LED packages 1.

When the light is emitted from the LED chip 20 to pass through the encapsulant 30 and the lens part 40, the light is diffused at the diffuser 32, thereby reflected or scattered in more various directions, allowing uniform mixing of colors. This is suitable for a structure such as the LCD backlight unit, which requires uniform mixing of red, green and blue lights.

In addition, the LED package 1 is a structure in which the light from the LED chip 20 is emitted out of the package without distortion by the assistance of only the diffuser 32. Thus, the lens part 40 is free to be configured in various structures. That is, the lens part 40 can have various structures such as in a small height or asymmetrical shape depending on the structural characteristics of the LCD backlight unit, thereby increasing a degree of freedom of the lens part 40.

In addition, the lens part 40 can be made of a material mixed with a phosphor 42 in addition to the diffuser 32, enabling more various color mixing, thereby attaining desired good quality white light.

According to the present invention set forth above, the light generated from the LED chip passes through the encapsulant containing the diffuser and the lens part to exit the package, achieving uniform diffusion and emission without distortion of light, thereby obtaining a uniform light source with an enlarged radiating angle.

In addition, as light generated from the LED chip is emitted in a wider angle by the diffuser, the lens part can be configured variously such as with a lower height, thereby reducing the thickness and increasing a degree of freedom of the lens part.

Furthermore, the invention allows a wide radiating angle, enabling construction of the LCD backlight unit with a fewer number of LED packages and with a reduced number of LED package components, thereby reducing the manufacturing costs of the LCD backlight unit.

While the present invention has been shown and described in connection with the preferred embodiments, the invention may be embodied in many different forms and should not be construed as limited to the embodiments set forth herein. It will be apparent to those skilled in the art that modifications and variations can be made without departing from the spirit and scope of the invention as defined by the appended claims.

What is claimed is:

1. A light emitting diode package comprising:
   a substrate with an electrode formed thereon;
   a light emitting diode chip mounted on the substrate;
   an encapsulant applied around the light emitting diode chip, the encapsulant containing a diffuser; and
   a lens part disposed on the light emitting diode chip and the encapsulant to radiate light in a wide angle,
   whereby light from the light emitting diode chip is emitted out of the package without distortion.

2. The light emitting diode package according to claim 1, wherein the substrate has a step formed on an upper surface thereof, the step surrounding a portion of the substrate where the light emitting diode chip is mounted.

3. The light emitting diode package according to claim 1, wherein the substrate has a reflective layer formed on a side surface of a recessed portion formed on an upper surface thereof, the reflective layer surrounding the light emitting diode chip mounted on the substrate.

4. The light emitting diode package according to claim 1, wherein the lens part is made of a material mixed with a phosphor.

5. The light emitting diode package according to claim 1, wherein the lens part is made of a material mixed with a diffuser.

6. The light emitting diode package according to claim 1, wherein the lens part is made of a material mixed with a phosphor and a diffuser.

* * * * *